US005578529A

United States Patent [19]

Mullins

[11] Patent Number: 5,578,529

[45] Date of Patent: Nov. 26, 1996

[54] METHOD FOR USING RINSE SPRAY BAR IN CHEMICAL MECHANICAL POLISHING

[75] Inventor: James M. Mullins, Austin, Tex.

[73] Assignee: Motorola Inc., Schaumburg, Ill.

[21] Appl. No.: 459,231

[22] Filed: Jun. 2, 1995

[51] Int. Cl.[6] ........................ H01L 21/304; H01L 21/306; B08B 3/02

[52] U.S. Cl. ........................ 437/228; 156/636.1; 451/287; 451/41; 134/6; 134/33

[58] Field of Search .......................... 437/228; 156/636.1, 156/645 LP; 451/283, 285, 287, 288, 41; 134/7, 6, 33

[56] References Cited

U.S. PATENT DOCUMENTS

| | | | |
|---|---|---|---|
| 3,342,652 | 9/1967 | Reisman et al. | 156/636.1 |
| 3,583,110 | 6/1971 | Scott | 51/283 |
| 4,680,893 | 7/1987 | Cronkhite et al. | 51/5 R |
| 4,891,110 | 1/1990 | Libman et al. | 204/181.1 |
| 5,081,051 | 1/1992 | Mattingly et al. | 437/10 |
| 5,216,843 | 6/1993 | Breivogel et al. | 51/131.1 |
| 5,244,534 | 9/1993 | Yu et al. | 156/636 |
| 5,272,104 | 12/1993 | Schrantz et al. | 437/63 |
| 5,291,693 | 3/1994 | Nguyen | 51/283 R |
| 5,320,706 | 6/1994 | Blackwell | 156/636 |
| 5,421,768 | 6/1995 | Fujiwara et al. | 451/283 |

FOREIGN PATENT DOCUMENTS

| | | | |
|---|---|---|---|
| 3010769 | 1/1991 | Japan | B42B 53/10 |

*Primary Examiner*—Robert Kunemund
*Assistant Examiner*—Matthew Whipple
*Attorney, Agent, or Firm*—George R. Meyer

[57] ABSTRACT

A rinse spray bar (24), added to CMP equipment (10), provides complete and uniform wetting and rinsing of the polishing pad (12) for an improved process. The rinse spray bar has a first opening (26) running through a portion of its length and multiple second openings (28) connected to the first opening to create multiple flow paths for a rinse agent. These second openings (28) are capped with spray nozzles (36) on the bottom surface of the rinse spray bar so that the rinse agent can be sprayed out from the second openings at a pressure higher than ambient such that the sprays patterns overlap each other to ensure uniform wetting. An in-line valve (34) adjusts and controls the pressure of the incoming rinse agent through the input line (30) so that the spray nozzle pressure can be varied. The rinse spray bar can be used at every polishing pad station in the CMP apparatus.

27 Claims, 1 Drawing Sheet

METHOD FOR USING RINSE SPRAY BAR IN CHEMICAL MECHANICAL POLISHING

FIELD OF THE INVENTION

The present invention relates in general to semiconductor processing and more specifically to a rinse spray bar for use in chemical mechanical polishing of a semiconductor wafer.

BACKGROUND OF THE INVENTION

One aspect of current semiconductor wafer processing generally involves forming dielectric layers alternating between metal layers on a semiconductor wafer. The formation of each layer, either dielectric or metal, often results in a conformal layer which corresponds to underlying surface topography. Planarization of the surface of these layers is frequently required. The art provides various methods for planarizing the wafer surface. One such method employs abrasive polishing to remove protrusions along the surface of the top layer on the semiconductor wafer. In this method, the semiconductor wafer is placed faced down on a table covered with a polishing pad which has been coated with a slurry or abrasive material. Both the wafer and the table are then rotated relative to each other to remove the protrusions on the surface of the wafer. This process of planarizing the wafer surface is generally referred to as chemical mechanical polishing (CMP).

An important part of the CMP process is the rinsing of the wafer and polishing pad. Presently, a tube is attached to the CMP equipment to dispense liquids onto the polishing pad at the center of the pad. The liquid being used for the rinsing step is water, although the tube is also equipped to dispense the slurry materials used in the polishing step. The tube extends toward the center of polishing pad and merely dispenses the water through an open hole at the end of the tube. This method relies on the centrifugal force generated by the rotation of the polishing pad to distribute the water over the entire surface of the polishing pad.

However, the prior art method has several disadvantages. One such disadvantage is that the water tends to travel radially outward from the center of the polishing pad in channels or rivulets instead of being evenly distributed over the entire surface area of the polishing pad as desired. The surface area between the water channels can remain dry. Consequently, uneven wetting of the polishing pad occurs, and the resulting polishing surface becomes non-uniform. This degradation in polishing pad surface results in low, unstable, and unpredictable polish rates leading to a non-uniform polished wafer surface which is undesirable. Another disadvantage is that the non-uniform polishing also shortens the useful life of the polishing pad which must then be replaced leading to longer equipment down time as well as adding to the cost of CMP.

Thus, a method for attaining a uniform wetting and rinsing of the polishing pad to maintain a saturated and stable surface for polishing to avoid an uneven polished wafer surface is desired.

It is important to point out that the illustrations may not necessarily be drawn to scale, and that there may be other embodiments of the present invention which are not specifically illustrated.

DETAILED DESCRIPTION OF A PREFERRED EMBODIMENT

The present invention provides, in one embodiment, a rinse spray bar for use in CMP to polish a semiconductor wafer. Embodiments of the invention may be used in conjunction with all polishing pad stations in the CMP apparatus. The rinse spray bar is composed of a chemically neutral, rigid, elongated member having a first opening running through a portion of its length for a rinse agent to flow therethrough. In addition, the rinse spray bar has multiple second openings, located along the length of the elongated member which are connected to the first opening so that the rinse agent has multiple flow paths. The centerlines of the second openings are substantially perpendicular to the centerline of the first opening. These second openings are capped with spray nozzles on the bottom surface of the elongated member so that the rinse agent can be sprayed out from the second openings at a pressure higher than ambient. The rinse spray bar is positioned above the polishing pad such that the spray nozzles are pointed downward to the surface of the pad and such that the rinse spray bar is substantially parallel to the surface of the pad. A line which dispenses the rinse agent is attached to the rinse spray bar. An in-line valve adjusts and controls the pressure of the incoming rinse agent so that the spray nozzle pressure can be varied as needed. The rinse spray bar may be turned on as needed during the CMP process to rinse off the slurry and the residue in the various polishing steps. The multiple nozzles spraying the rinse agent allow uniform wetting and rinsing of the polishing pad and the semiconductor wafer polished surface. These and other features, and advantages, will be more clearly understood from the following detailed description taken in conjunction with the accompanying drawings.

Figure 1:
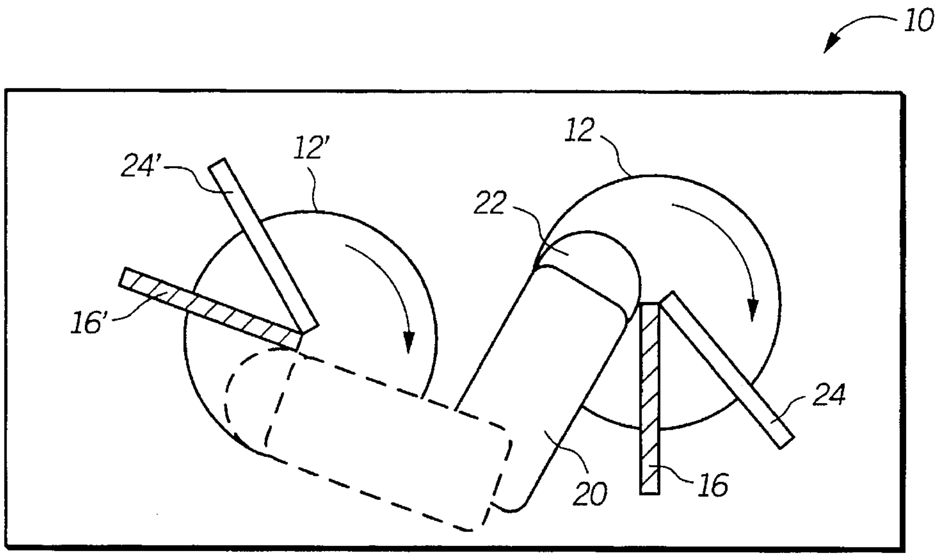
FIG. 1 illustrates, in a top view, a schematic of a polishing apparatus to illustrate a method of use for a rinse spray bar of the invention.

FIG. 1 illustrates, in a top view, a schematic of a CMP polishing apparatus 10 having a rinse spray bar 24 of the invention. As shown, the CMP apparatus 10 has two polishing pad stations: polishing pads 12 and 12'. Polishing pad 12 is the primary or first polishing pad, while polishing pad 12' is the fine or final polishing pad. Both polishing pads rotate during polishing as depicted by the arrows in the figure. The polish arm 20 holds a semiconductor wafer 22, face down, over the surface of the polishing pad 12. The polish arm 20 is movable to position the semiconductor wafer 22 over the surface of the final polishing pad 12' once the wafer has undergone the initial polishing step. The tubes 16 and 16' are part of the pre-existing apparatus. These tubes extend radially toward the center of the polishing pads and have only an open hole at the end of each tube to dispense either slurry or water at the center of the pad. These tubes 16 and 16' have multiple purposes of dispensing both the needed slurries for the polishing steps and water for the rinsing steps. As stated previously, these tubes are limited to dispensing the liquids at the open hole at the end of the tubes. The present invention adds rinse spray bars 24 and 24' to the CMP apparatus for an improved rinsing step leading to many advantages for the entire CMP process. The rinse spray bars 24 and 24' also extend radially toward the center of the polishing pads. The exact angle between the tube 16 and the rinse spray bar 24 is not critical. Rather, their locations can varied for a best fit with the existing apparatus in whatever space is available. The use of rinse spray bars has been reduced to practice on a Westech polishing system. However, the rinse spray bar's use is in no way limited to a Westech system but can be fitted for use with any CMP apparatus.

Figure 2:
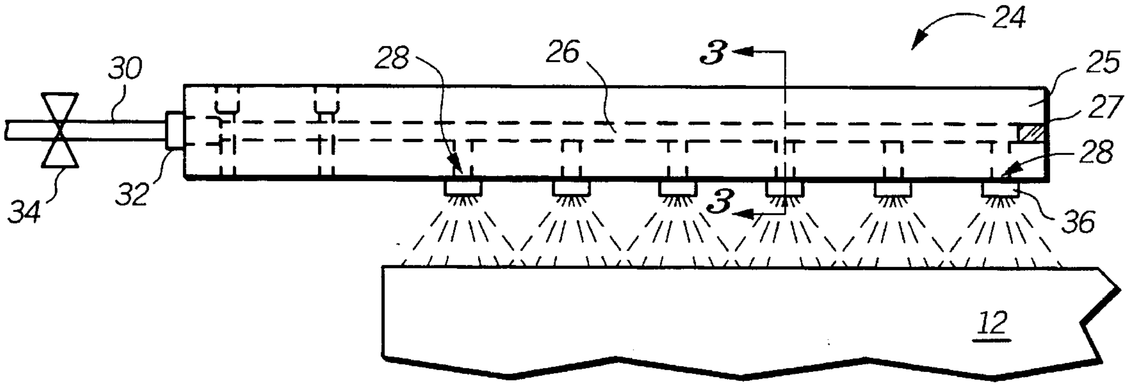
FIG. 2 illustrates, in a side view, a rinse spray bar in accordance with the present invention.

FIG. 2 illustrates, in a side view, the rinse spray bar 24 of FIG. 1 overlying the polishing pad 12 in accordance with the present invention. The rinse spray bar 24 is composed of an elongated member 25 having a first opening 26 running through a portion of its length. The length of the rinse spray bar 24 is dependent on the size of polishing pad because the bar needs to be sufficiently long to extend to the center of the polishing pad. However, unlike the tube known in the prior art, the rinse spray bar 24 of the present invention does not have an open hole at the end of the bar because the operation of the rinse spray bar is based on a different principle than the tube of the prior art. The end of the rinse spray bar 24 is closed, either by plugging the first opening 26 with a plug 27 or by not boring the opening completely through the length of the elongated member 25. The plug 27 may be made of the same material as the elongated member 25 or any chemically neutral and non-reactive material. The prior art dispenses the rinse agent through an open hole at the end of the tube and relies on centrifugal force to distribute the rinse agent outwardly over the surface area of the polishing pad. This method is inefficient and has many shortcomings as discussed above.

In contrast, the rinse spray bar 24 of the present invention connects a series of second openings 28 disposed along the length of the elongated member 25 to the first opening 26 to form multiple flow paths for the rinse agent, as shown in FIG. 2. Although not required, it may be preferable to progressively increase the size of the second openings, starting from the input end of the rinse spray bar 24. For example, a diameter of 1/32 inch (0.79 mm) was used for the first second opening 28 closest to the input end, with each subsequent second opening becoming progressively larger by 1/32 inch (0.79 mm). These dimensions are only intended to be illustrative and not limiting. The major axes of the second openings 28 are approximately perpendicular to the major axis of the first opening 26. Additionally, the second openings 28 are spaced approximately evenly apart along the length of the rinse spray bar 24 for an even dispersal of the rinse agent over the surface of the polishing pad 12. A practical range for the spacing between two adjacent second openings 28 holes is from approximately 30 to 45 mm. The object is to obtain overlapping spray patterns for complete and uniform coverage of the polishing pad surface.

Spray nozzles 36 are required to be fitted to the second openings 28 to evenly disperse the rinse agent over the surface area of the polishing pad 12. If spray nozzles 36 are not used, then only clean spots, corresponding to the locations of the second openings, can be observed on the polishing pad. This spotty cleaning leads to uneven aging of the pad and to non-uniform removal rates during the polishing steps. However, the spray nozzles 36 allow the rinse agent to be sprayed out at a pressure higher than ambient, and because the nozzles have an adjustable open position, the spray pattern is fan-shaped as illustrated in FIG. 2. These spray patterns are designed to overlap one another to provide complete wetting of the surface area of the polishing pad.

The rinse agent is sourced from a line 30 that is attached to the input end of the rinse spray bar 24 with a connector 32. The connector 32 can be of any generic kind, although a Flaretek connector was used in the reduction to practice. The rinse agent may be water or ammonium hydroxide ($NH_4OH$). Alternatively another suitable liquid may also be dispensed through the rinse spray bar 24. An in-line valve 34 controls the incoming pressure of the rinse agent. In a reduction to practice, 0.375 inch (9.5 mm) teflon tubing was used for the line 30 and a needle valve was used to control the in-line pressure. However, other equivalent substitutes may also be used for the line 30 and in-line valve 34 without affecting the operation of the rinse spray bar 24. The spray nozzles used in the reduction to practice are of the standard type known to one of ordinary skill in the art and are easily available through nozzle manufacturers. In practicing the present invention, it is desirable to set the separation distance between the bottom surface of the rinse spray bar 24 and the polishing pad 12 surface to a practical distance. Then the spray nozzles and in-line valve are adjusted to obtain uniform and overlapping spray of the liquid rinse agent. A pressure of 10 psi (69 kPa) above atmospheric pressure was used in the reduction to practice with a 1 inch (25 mm) separation but it is expected that a range of pressures from 5 to 15 psi (35 to 100 kPa) would be suitable for a practical separation distance. However, it should be understood that a pressure increase may allow the rinse spray bar and polishing pad to be spaced farther apart than the 1 inch used in the reduction to practice. Additionally, an increase in the pressure would allow the second openings (and their corresponding spray nozzles) to be spaced farther apart due to the overlap of the spray patterns.

Figure 3:
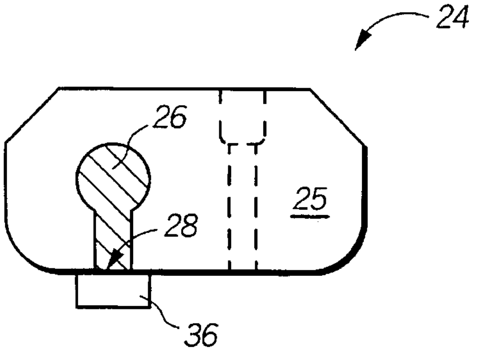
FIG. 3 illustrates, in a cross-sectional view along line 3—3, the rinse spray bar of FIG. 2.

A cross-section taken along line 3—3 illustrates the shape of the rinse spray bar 24 in more detail. As shown in FIG. 3, the top edge of the rinse spray bar 24 is tapered or beveled to reduce accumulation of liquids on top of the rinse spray bar 24. However, rounding of the corners may be sufficient to allow a liquid to drain off the top surface. Alternatively, the top surface of the rinse spray bar 24 may be sloped or domed to allow liquid drainage. Also in FIG. 3, the shape of the first opening 28 is illustrated as being circular because a circular hole is the easiest to make. However, other shapes, such as an ellipse, may also be used as long as they are manufacturable. A circular hole diameter ranging from 5 to 10 mm is sufficient. A flat bottom surface is desired to affix the spray nozzles 36 and to maintain a set distance from each spray nozzle 36 and the polishing pad 12 surface.

The rinse spray bar 24 should be made from a rigid and machinable material that is chemically neutral and non-reactive to the chemicals used in the CMP process. The slurry used in CMP is very corrosive, having a pH of 14, so the material should be able to withstand those type of conditions. It is also important that the rinse spray bar 24 be composed of a sufficiently rigid material that does not warp or flex at the required length of the bar because the spray nozzles 36 on the bottom surface of the rinse spray bar 24 and the polishing pad 12 surface should be substantially parallel to each other for even spraying of the rinse agent. Polyvinylidine fluoride (PVDF) was the material successfully used in the reductions to practice where the rinse spray bars varied from 15.75 to 16 inches (40 to 41 cm) in length by 1 to 1.5 inches (2.5 to 3.8 cm) in width by 0.75 inch (1.9 cm) in thickness. However, practicing the invention is not limited to PVDF. Rather other materials meeting the required characteristics may be used. One such material is polymethyl methacrylate (PMMA). Additionally, physical dimensions for the rinse spray bar 24 may vary from those used in the reduction to practice. It is expected that a practical range for the length may vary from approximately 35 to 45 cm. A practical width would range from approximately 25 to 45 mm, and a practical thickness would range from 15 to 20 mm.

In a method of use for the rinse spray bar 24 in a CMP apparatus, the polish arm 20 which carries the semiconductor wafer 22 to be polished is positioned over the primary polishing pad 12. The semiconductor wafer 22 and the polishing pad 12 are rotated relative to each other for a specified amount of time until the excess material from surface of the wafer is removed, typically several hundred angstroms of material. The rotational speed is controllable by the equipment controls and is in no way limiting to the use of the present invention. Once the desired amount of material has been removed from the wafer surface, the rinse spray bar 24 is turned on to disperse a rinse agent over the surface of the polishing pad. The rinse agent, which can be either water or ammonium hydroxide or another suitable liquid, removes residue on the wafer surface generated by the polishing step as well as cleans the polishing pad 12 for subsequent polishing of other wafers. After the first polishing step, it is typical for the semiconductor wafer 22 to be given a final polish on the final polish pad 12'. The use of the rinse spray bar 24' after fine polishing of the semiconductor wafer 22 helps to remove residue left in the scribe lines on the wafer surface from the polishing step.

The foregoing description and illustrations contained herein demonstrate many of the advantages associated with the present invention. In particular, it has been revealed that the present invention has many advantages over the prior art. It is simple yet very effective. Corrosion is not an issue because the plastic material used for the rinse spray does not react with CMP chemicals. Actual reduction to practice has shown that uniform wetting and rinsing of the polishing pad can be achieved through the use of the present invention. This leads to uniform removal rates which is a dramatic improvement over the prior art where uneven removal rates were common because of the non-uniform wetting and rinsing of the polishing pad with the tube. This uniformity in removal rates, achieved through use of rinse spray bars, adds greater predictability to the CMP process. The use of the rinse spray bar also has the advantage of extending the life of the polishing pad by allowing uniform aging of the pad. Additionally, residue buildup from prior polishing steps can be rinsed away with the pressurized sprays of rinse agent. Another major advantage to the present invention is that it is extremely cost effective. The rinse spray bar is easily made in a machine shop using readily available and inexpensive materials.

Thus it is apparent that there has been provided, in accordance with the invention, a rinse spray bar for use in a CMP process that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the dimensions of the rinse spray bar may be varied from those discussed. Likewise, the number of holes and spray nozzles may also be varied depending on the length of the rinse spray bar as well as the surface area to be covered. In a variation on a method of use, one can polish the surface of the semiconductor wafer using a slurry. Then a rinse step using water through the rinse spray bar uniformly wets and rinses the surface of the polishing pad and the polished wafer surface. Next, ammonium hydroxide is dispensed to clean the surface of the wafer. The ammonium hydroxide may also be dispensed through the rinse spray bar 24'. The rinse spray bar may be manufactured with multiple first openings to accommodate the dispersal of different types of liquids. Therefore, it is intended that this invention encompasses all such variations and modifications falling within the scope of the appended claims.

I claim:

1. A method for polishing a semiconductor wafer, comprising the steps of:

providing a rinse bar connected to a CMP apparatus, the rinse bar having an elongated member that has:

first and second ends, a first opening along a portion of a length of the elongated member for a rinse agent to flow from the first end toward the second end, and a plurality of second openings on a surface of the elongated member, wherein the plurality of second openings is spaced along the length of the elongated member, and wherein the plurality of second openings is connected to the first opening for the rinse agent to flow from the first opening into the plurality of second openings;

positioning the rinse bar, with the plurality of second openings pointing downward, over a polishing pad, wherein the rinse bar extends from a point near an edge of the polishing pad toward a point near a center of the polishing pad;

polishing a surface of a semiconductor wafer with the polishing pad to form a polished surface; and introducing the rinse agent at a pressure no greater than approximately 15 psi above atmospheric pressure through the rinse bar onto the polishing pad while the semiconductor wafer overlies the polishing pad to clean the polished surface.

2. The method of claim 1, wherein the step of positioning the rinse bar comprises locating the rinse bar at approximately 25 millimeters above the polishing pad.

3. The method of claim 1, wherein the step of introducing the rinse agent introduces a liquid selected from a group consisting of water and ammonium hydroxide.

4. The method of claim 1, wherein the step of positioning the semiconductor wafer comprises positioning a wafer having a metal surface layer.

5. The method of claim 1, wherein the step of introducing the rinse agent introduces said rinse agent at approximately 5 to 15 psi above atmospheric pressure.

6. The method of claim 1, wherein the step of introducing is performed such that all points along a spraying line segment along the polishing pad are simultaneously sprayed, wherein the spraying line segment is a line segment along the polishing pad that has a first line segment end directly underlying the second opening that lies closest to the first end of the rinse bar and a second line segment end directly underlying the second opening that lies closest to the second end of the rinse bar.

7. The method of claim 1, wherein the step of providing a rinse bar is performed such that the rinse bar has a plurality of spray nozzles, each spray nozzle being attached to one of the plurality of second openings, each spray nozzle having an adjustable open position such that the rinse agent may be dispensed from the rinse bar at a pressure higher than ambient pressure.

8. The method of claim 1, wherein the step of providing a rinse bar is performed such that the CMP apparatus includes a slurry feed means.

9. The method of claim 1, wherein the step of introducing is performed such that none of the rinse agent flows through the second end of the rinse spray bar.

10. A method for polishing a semiconductor wafer, comprising the steps of:

providing a rinse spray bar connected to a CMP apparatus, the rinse spray bar having an elongated member, composed of a polymer, having first and second ends, a first opening through a portion of a length of the elongated member for a rinse agent to flow from the first end toward the second end, and a plurality of second openings on a surface of the elongated member, wherein the plurality of second openings is spaced along the length of the elongated member, and wherein the plurality of second openings is connected to the first opening for the rinse agent to flow into the plurality of second openings; and a plurality of spray nozzles, each spray nozzle being attached to one of the plurality of second openings, each spray nozzle having an adjustable open position such that the rinse agent may be dispensed from the rinse spray bar at a pressure higher than ambient pressure;

positioning the rinse spray bar, with the plurality of spray nozzles pointing downward, over a polishing pad, wherein the rinse spray bar extends from a point near an edge of the polishing pad toward a point near a center of the polishing pad, and wherein the rinse spray bar is approximately parallel to a surface of the polishing pad;

polishing a surface of a semiconductor wafer with the polishing pad to form a polished surface; and spraying the rinse agent at a pressure no greater than approximately 15 psi above atmospheric pressure through the rinse spray bar in overlapping spray patterns onto the polishing pad while the semiconductor wafer overlies the polishing pad to clean the polished surface.

11. The method of claim 10, wherein the step of positioning the rinse spray bar comprises locating the rinse spray bar at approximately 25 millimeters above the polishing pad.

12. The method of claim 10, wherein the step of spraying the rinse agent introduces a liquid selected from a group consisting of water and ammonium hydroxide.

13. The method of claim 10, wherein the step of spraying the rinse agent sprays said rinse agent at approximately 5 to 15 psi above atmospheric pressure.

14. The method of claim 10, wherein the step of polishing the surface of the semiconductor wafer is performed on a primary polishing pad.

15. The method of claim 14, wherein step of polishing the surface of the semiconductor wafer is performed on a final polishing pad and wherein the step of spraying the rinse agent sprays water.

16. The method of claim 10, further comprising the step of spraying ammonium hydroxide after the step of spraying water to remove residue from scribe lines on the polished surface of the semiconductor wafer.

17. The method of claim 10, wherein the step of spraying is performed such that none of the rinse agent flows through the second end of the rinse spray bar.

18. The method of claim 10, wherein the step of providing is performed such that the CMP apparatus includes a slurry feed means.

19. A method for polishing a semiconductor wafer, comprising the steps of:

providing a CMP apparatus having a slurry feed means, a rinse bar, and a polishing pad connected to a CMP apparatus, wherein the rinse bar includes:

an elongated member having first and second ends;

a first opening along a portion of a length of the elongated member for a first rinse agent to flow from the first end toward the second end; and a plurality of second openings on a surface of the elongated member, wherein the plurality of second openings is spaced along the length of the elongated member, wherein the plurality of second openings is connected to the first opening for the first rinse agent to flow from the first opening into the plurality of second openings;

positioning the rinse bar over the polishing pad, such that the rinse bar extends from a point near an edge of the polishing pad toward a point near a center of the polishing pad and such that the plurality of second openings points downward toward the polishing pad;

polishing a surface of a semiconductor wafer by using the polishing pad to form a polished surface; and introducing the first rinse agent at a pressure no greater than 15 psi above atmospheric pressure through the rinse bar onto the polishing pad while the semiconductor wafer overlies the polishing pad to clean the polished surface.

20. The method of claim 19, wherein the step of introducing the first rinse agent introduces a liquid selected from a group consisting of water and ammonium hydroxide.

21. The method of claim 19, wherein the step of positioning the semiconductor wafer comprises positioning a wafer having a metal surface layer.

22. The method of claim 19, wherein the step of introducing the first rinse agent introduces said first rinse agent at approximately 5 to 15 psi above atmospheric pressure.

23. The method of claim 19, wherein the step of introducing is performed such that all points a along a spraying line segment along the polishing pad are simultaneously sprayed, wherein the spraying line segment is a line segment along the polishing pad that has a first line segment end directly underlying the second opening that lies closest to the first end of the rinse bar and a second line segment end directly underlying the second opening that lies closest to the second end of the rinse bar.

24. The method of claim 19, wherein the step of providing a rinse bar is performed such that the rinse bar has a plurality of spray nozzles, each spray nozzle being attached to one of the plurality of second openings, each spray nozzle having an adjustable open position such that the first rinse agent may be dispensed from the rinse bar at a pressure higher than ambient pressure.

25. The method of claim 19, wherein the step of providing is performed such that the slurry feed means is a slurry feed tube.

26. The method of claim 25, wherein the step of polishing comprises a step of slurry feed tube dispenses a slurry near the center of the polishing pad.

27. The method of claim 25, wherein the step of introducing further comprises a step of introducing second rinse agent through the slurry feed tube to the polishing pad.

* * * * *